United States Patent
Pritchard et al.

(10) Patent No.: US 9,329,847 B1
(45) Date of Patent: *May 3, 2016

(54) HIGH-LEVEL LANGUAGE CODE SEQUENCE OPTIMIZATION FOR IMPLEMENTING PROGRAMMABLE CHIP DESIGNS

(71) Applicant: Altera Corporation, San Jose, CA (US)

(72) Inventors: Jeffrey Orion Pritchard, Santa Cruz, CA (US); Jarrod Colin James Blackburn, San Jose, CA (US); David James Lau, Scotts Valley, CA (US); Philippe Molson, San Jose, CA (US); James L. Ball, Scotts Valley, CA (US); Jesse Kempa, Felton, CA (US)

(73) Assignee: ALTERA CORPORATION, San Jose, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 14/070,361

(22) Filed: Nov. 1, 2013

Related U.S. Application Data

(63) Continuation of application No. 12/966,882, filed on Dec. 13, 2010, now Pat. No. 8,578,356, which is a continuation of application No. 11/385,142, filed on Mar. 20, 2006, now Pat. No. 7,873,953.

(60) Provisional application No. 60/760,584, filed on Jan. 20, 2006.

(51) Int. Cl.
  *G06F 9/45* (2006.01)
  *G06F 12/00* (2006.01)

(52) U.S. Cl.
  CPC .................................. *G06F 8/443* (2013.01)

(58) Field of Classification Search
  None
  See application file for complete search history.

(56) References Cited

U.S. PATENT DOCUMENTS

| | | | |
|---|---|---|---|
| 3,510,847 A * | 5/1970 | Carlson | G06F 9/355 711/220 |
| 4,868,823 A | 9/1989 | White, Jr. et al. | |
| 5,371,877 A | 12/1994 | Drako et al. | |
| 5,394,535 A | 2/1995 | Ohuchi | |
| 5,404,437 A * | 4/1995 | Nguyen | 715/203 |
| 5,544,124 A | 8/1996 | Zagar et al. | |
| 5,544,338 A | 8/1996 | Forslund | |
| 5,555,417 A * | 9/1996 | Odnert | G06F 8/441 717/144 |
| 5,577,230 A * | 11/1996 | Argade et al. | 711/150 |
| 5,606,697 A * | 2/1997 | Ono | G06F 8/443 717/147 |
| 5,630,086 A | 5/1997 | Marietta et al. | |
| 5,729,711 A * | 3/1998 | Okamoto | G06F 15/7846 711/130 |

(Continued)

OTHER PUBLICATIONS

Budiu et al., Optimizing Memory Access for Spatial Computation, published by IEEE 2003, pp. 216-227.*

(Continued)

*Primary Examiner* — Xi D Chen
*Assistant Examiner* — Zheng Wei
(74) *Attorney, Agent, or Firm* — Kwan & Olynick LLP

(57) ABSTRACT

Methods and apparatus are provided for implementing a programmable chip using a high-level language. Code sequences such as high-level language software critical loops are converted into read/transform/write (RXW) processes with buffer based flow control between the processes. Having separate read and write processes allows an arbitrary number of sequential reads/writes to occur in any order, subject to buffer size, allowing bursting/sequential transactions that are more efficient than random accesses.

20 Claims, 7 Drawing Sheets

(56) References Cited

U.S. PATENT DOCUMENTS

| | | | |
|---|---|---|---|
| 5,761,400 A | 6/1998 | Derby et al. | |
| 5,778,415 A | 7/1998 | Marietta et al. | |
| 5,920,722 A * | 7/1999 | Damron | G06F 8/447 |
| | | | 717/146 |
| 5,969,986 A | 10/1999 | Wong et al. | |
| 6,009,549 A * | 12/1999 | Bliss | G11B 20/10009 |
| | | | 360/51 |
| 6,058,465 A | 5/2000 | Nguyen | |
| 6,069,839 A | 5/2000 | Pancholy et al. | |
| 6,163,837 A * | 12/2000 | Chan et al. | 712/216 |
| 6,167,487 A | 12/2000 | Camacho et al. | |
| 6,262,936 B1 | 7/2001 | Arcoleo et al. | |
| 6,262,937 B1 | 7/2001 | Arcoleo et al. | |
| 6,275,920 B1 | 8/2001 | Abercrombie et al. | |
| 6,292,403 B1 | 9/2001 | Pancholy et al. | |
| 6,343,353 B1 | 1/2002 | Kim | |
| 6,385,128 B1 | 5/2002 | Arcoleo et al. | |
| 6,408,345 B1 | 6/2002 | Fuoco et al. | |
| 6,473,847 B1 * | 10/2002 | Kamiya | G06F 12/1081 |
| | | | 711/171 |
| 6,496,910 B1 * | 12/2002 | Baentsch | G06F 9/44521 |
| | | | 711/103 |
| 6,539,467 B1 | 3/2003 | Anderson et al. | |
| 6,597,627 B2 | 7/2003 | Arata et al. | |
| 6,640,299 B1 | 10/2003 | Mang et al. | |
| 6,728,869 B1 | 4/2004 | Mang et al. | |
| 6,732,247 B2 | 5/2004 | Berg et al. | |
| 6,738,796 B1 | 5/2004 | Mobini | |
| 6,745,319 B1 | 6/2004 | Balmer et al. | |
| 6,834,338 B1 | 12/2004 | Hoyle et al. | |
| 6,857,035 B1 * | 2/2005 | Pritchard et al. | 710/110 |
| 6,859,872 B1 | 2/2005 | Anderson et al. | |
| 6,877,150 B1 | 4/2005 | Miller et al. | |
| 6,912,706 B1 | 6/2005 | Stamm et al. | |
| 6,948,186 B1 | 9/2005 | Brosey | |
| 6,980,649 B1 | 12/2005 | Batcher | |
| 7,006,634 B1 | 2/2006 | Batcher | |
| 7,015,921 B1 | 3/2006 | Trivedi et al. | |
| 7,062,734 B2 | 6/2006 | Collins, Jr. | |
| 7,111,155 B1 | 9/2006 | Anderson et al. | |
| 7,111,156 B1 | 9/2006 | Mang et al. | |
| 7,143,388 B1 | 11/2006 | Miller et al. | |
| 7,162,591 B1 | 1/2007 | Miranda et al. | |
| 7,184,442 B1 | 2/2007 | Roos | |
| 7,246,142 B2 | 7/2007 | Sexton et al. | |
| 7,305,540 B1 | 12/2007 | Trivedi et al. | |
| 7,389,405 B2 | 6/2008 | Boutaud | |
| 7,484,078 B2 * | 1/2009 | Bink et al. | 712/218 |
| 7,580,287 B2 | 8/2009 | Aritome | |
| 7,653,780 B2 * | 1/2010 | Takahashi | G06F 12/0893 |
| | | | 365/189.011 |
| 7,930,689 B2 | 4/2011 | Cabillic et al. | |
| 8,291,396 B1 * | 10/2012 | Lau | G06F 17/5054 |
| | | | 716/104 |
| 2002/0046331 A1 | 4/2002 | Davis et al. | |
| 2002/0091895 A1 * | 7/2002 | Haines | G06F 12/0866 |
| | | | 711/112 |
| 2002/0100021 A1 | 7/2002 | Hunter et al. | |
| 2002/0138706 A1 | 9/2002 | Hugly | |
| 2003/0005422 A1 * | 1/2003 | Kosche | G06F 8/4451 |
| | | | 717/154 |
| 2003/0101320 A1 * | 5/2003 | Chauvel | G06F 12/0888 |
| | | | 711/154 |
| 2003/0145184 A1 | 7/2003 | Sato et al. | |
| 2004/0111569 A1 * | 6/2004 | Arimilli | G06F 9/30032 |
| | | | 711/154 |
| 2004/0111570 A1 * | 6/2004 | Arimilli | G06F 12/0831 |
| | | | 711/154 |
| 2004/0148595 A1 * | 7/2004 | Dutta | G06F 8/4441 |
| | | | 717/159 |
| 2004/0181638 A1 | 9/2004 | Linehan et al. | |
| 2005/0138613 A1 | 6/2005 | Archambault et al. | |
| 2005/0240745 A1 | 10/2005 | Iyer et al. | |
| 2006/0026370 A1 | 2/2006 | Cabillic et al. | |
| 2006/0069894 A1 * | 3/2006 | Hollis | G06F 13/1689 |
| | | | 711/167 |
| 2006/0078108 A1 | 4/2006 | Batcher | |
| 2006/0236057 A1 * | 10/2006 | Beato et al. | 711/167 |
| 2006/0248275 A1 | 11/2006 | Blackmon et al. | |
| 2006/0253690 A1 | 11/2006 | Chen et al. | |
| 2008/0040581 A1 * | 2/2008 | Bink et al. | 712/218 |
| 2008/0114947 A1 | 5/2008 | Brox et al. | |
| 2009/0055603 A1 * | 2/2009 | Holt | G06F 15/16 |
| | | | 711/154 |

OTHER PUBLICATIONS

Faraboschi et al., Instruction Scheduling for Instruction Level Parallel Processors, published by IEEE, 2001, pp. 1633-1659W.*

Welch et al., Formal Analysis of Concurrent Java Systems, published by Communicating Process Architectures 2000, IOS Press 2000, pp. 275-301.*

Marathe et al., Adaptive Software Transactional Memory, published by Springer-Verlag Berlin Heidelberg 2005, pp. 354-368.*

"U.S. Appl. No. 11/385,142, Non Final Office Action mailed Apr. 1, 2010".

"U.S. Appl. No. 11/385,142, Notice of Allowance mailed Sep. 14, 2010".

"U.S. Appl. No. 11/385,142, Response filed Jun. 29, 2010 to Non Final Office Action mailed Apr. 1, 2010".

"U.S. Appl. No. 12/966,882, Non Final Office Action mailed Nov. 7, 2012".

"U.S. Appl. No. 12/966,882, Notice of Allowance mailed Jul. 3, 2013", 10 pgs.

Mandal et al., "Use of Multi-Port Memories in Programmable Structures for Architectural Synthesis", published by IEEE, 1996, pp. 341-351.

* cited by examiner

HIGH-LEVEL LANGUAGE CODE SEQUENCE OPTIMIZATION FOR IMPLEMENTING PROGRAMMABLE CHIP DESIGNS

CROSS REFERENCE TO RELATED APPLICATIONS

This application is a continuation of U.S. application Ser. No. 12/966,882, filed Dec. 13, 2010, which is now U.S. Pat. No. 8,578,356, and titled "HIGH-LEVEL LANGUAGE CODE SEQUENCE OPTIMIZATION FOR IMPLEMENTING PROGRAMMABLE CHIP DESIGNS", which is a continuation of U.S. application Ser. No. 11/385,142, filed Mar. 20, 2006, which is now U.S. Pat. No. 7,873,953, and titled "HIGH-LEVEL LANGUAGE CODE SEQUENCE OPTIMIZATION FOR IMPLEMENTING PROGRAMMABLE CHIP DESIGNS", and the benefit of priority to U.S. Provisional Application No. 60/760,584 filed Jan. 20, 2006 and titled "SPECIFYING HARDWARE RESOURCE COUNTS FOR HIGH-LEVEL LANGUAGE CODE SEQUENCES", all of which are incorporated by this reference in their entireties for all purposes.

BACKGROUND OF THE INVENTION

1. Field of the Invention

The present invention relates to programmable chips. In one example, the present invention relates to methods and apparatus for using a high-level programming language to implement a programmable chip.

2. Description of Related Art

Some mechanisms for implementing a programmable chip entail using a general purpose programming language or high-level language. In one example, code written in a general purpose programming language such as C or C++ is converted into a hardware descriptor language (HDL) file using a tool such as the DK1 Design Suite available from Celoxica Corporation of Abingdon, England. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oreg. and Synplify available from Synplicity Corporation of Sunnyvale, Calif.

However, mechanisms for optimizing implementation of a programmable chip design from a high-level language are limited. It is therefore desirable to provide improved methods and apparatus for improving programmable chip design implementation from high-level language code.

SUMMARY OF THE INVENTION

Methods and apparatus are provided for implementing a programmable chip using a high-level language. Code sequences such as high-level language software critical loops are converted into read/transform/write (RXW) processes with buffer based flow control between the processes. Having separate read and write processes allows an arbitrary number of sequential reads/writes to occur in any order, subject to buffer size, allowing bursting/sequential transactions that are more efficient than random accesses.

In one embodiment, a technique for implementing a programmable device is provided. A high-level language program is received. The high-level language program is configured to run on a conventional central processing unit. A code sequence associated with memory access is identified. The code sequence is associated with input data and output data. The code sequence is converted into separate read process circuitry, transform process circuitry, and write process circuitry corresponding to the code sequence for implementation on the programmable device. The read process circuitry is operable to perform an arbitrary number of memory read accesses and the write process circuitry is operable to perform an arbitrary number of memory write accesses to allow bulk memory operations.

In another embodiment, a programmable chip is provided. The programmable chip includes read process circuitry, transform process circuitry, and write process circuitry. Read process circuitry is configured to perform memory read accesses associated with a high-level language code sequence operable to run on a conventional central processing unit. Transform process circuitry configured to perform an operation associated with the high-level language code sequence. The write process circuitry is configured to perform memory write accesses associated with the high-level language code sequence. The read process circuitry, transform process circuitry, and write process circuitry are generated from the high-level language code sequence to allow bulk memory data transfer operations.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
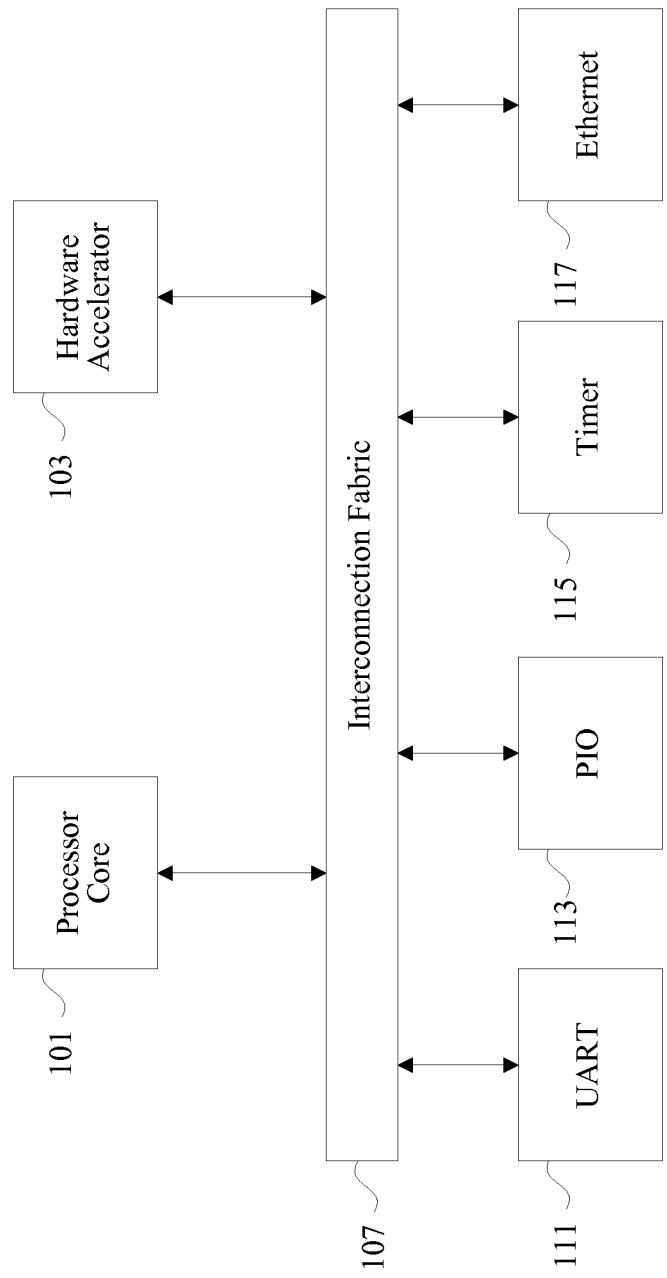
FIG. 1 is a diagrammatic representation showing a programmable device.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips and logic elements. However, it should be noted that the techniques of the present invention can be applied to different device architectures and a variety of resources. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Programmable chips include a variety of resources that can be allocated for different operations. In some examples, programmable chips include logic elements, preconfigured logic blocks, memory, and processor cores. A computer with a processor core, memory, local area network (LAN) interface, and a universal asynchronous receiver transmitter (UART) can be implemented on a single programmable device such as an FPGA. The programmable device can also include customized logic for performing specialized functions for optimizing a particular application. In one example, logic elements are allocated for implementing a digital signal processing (DSP) core for performing Fast Fourier Transform (FFT) operations. In another example, logic elements are allocated for optimizing video rendering functions.

Designers have a variety of options available for implementing a system on a programmable device. In typical instances, the designer provides both a hardware and a software design. A hardware design can be used to implement a particular hardware accelerator on the programmable device. Software can run on a general-purpose processor included on the device. Any logic or mechanisms supporting a general-purpose instruction set such as a reduced instruction set computing (RISC) instruction set, a complex instruction set computing (CISC), or a very long instruction word (VLIW), instruction set is referred to herein as a general-purpose processor or a central processing unit. Conventional processors include the Xeon line of processors available from Intel Corporation of Santa Clara, Calif. and the Opteron line of processors available from AMD of Sunnyvale, Calif. Conventional processing cores available for implementation on a system on a chip (SOC) or a system on a programmable chip (SOPC) include the ARM line of processor cores available from ARM Ltd. of Cambridge, England.

A system on a programmable chip typically includes logic implemented using a Hardware Description Language (HDL). However, using HDL may not be a very efficient or effective way of optimizing an application optimized programmable chip. HDL often requires knowledge about the underlying hardware, and relatively few people have familiarity with HDL.

Other languages for implementing logic on a device have been developed based on high-level programming languages. Any language that can be used to describe software functions and/or objects without extensive knowledge of the underlying hardware used to implement the software is referred to herein as a high-level language. Examples of high-level languages include C, C++, Java, and Pascal conventionally used by software engineers. Other variations include Matlab and VisualBasic. High-level languages are typically general purpose and interact with hardware using operating system associated application program interfaces (APIs).

The high-level language includes mechanisms for implementing function calls. The high-level language description is compiled into a generic sequential flow by parsing, building a symbol table, and generating a generic sequential flow using typical compiler techniques. Some tools including HDL Designer available from Mentor Graphics Corporation of Wilsonville, Oreg. and the DK1 Design Suite available from Celoxica of Abingdon, England provide high-level language like syntax, typically C-like syntax, for implementing a portion of a program in hardware while leaving the rest as a software implementation. However, tools that provide high-level language like syntax for implementing hardware on a programmable device have significant drawbacks.

One tool providing C-like syntax is Celoxica's DK1 Design Suite that uses a language referred to as Handel-C. Although Handel-C looks like C to a software engineer, there are significant differences. In order to use Handel-C, a software engineer has to go through extra training about hardware-specific concepts such as clock cycles, parallelism, and bit widths. When a software engineer wants to implement specific code using hardware acceleration, the engineer is required to determine what portion should be accelerated. Even determining what to accelerate often requires knowledge of the underlying hardware. The software engineer then typically has to make specific hardware calls in code sequences. One or more lines of software code are referred to herein as a code sequence. In one example, a code sequence is a subroutine and can be included in one or more files.

However, a variety of inefficiencies exist in current high-level language to hardware compilers. Problems arise when accessing pseudo-random access memories, such as synchronous dynamic random access memory (SDRAM) or double data rate random access memory (DDR-SDRAM). In typical implementations, when the pipeline for a critical loop is full and data accesses share the same memory, each data access must complete before the current stage can finish. Thrashing non-sequential memory accesses can result. For example, a read for one block of data may occur to allow processing on that block of data. After processing, the block of data is written to a nonsequential address in memory. Memory accesses tend to occur in non-sequential order. As burst-only memory (such as DDR) becomes more common, sequential accesses become almost required for performance.

According to various embodiments of the present invention, software code such as critical loop code is converted from using individual memory fetches to using separate read/transform/write (RXW) processes with buffer based, e.g. first in first out (FIFO) based, flow control between the processes. The read/transform/write (RXW) processes may be RXW process circuitry blocks implemented on a programmable chip. Having separate read and write processes allows an arbitrary number of sequential reads/writes to occur in any order, subject to buffer size. Consequently, bulk reads and bulk writes can occur. This allows for bursting/sequential transactions that are more efficient than random accesses. It is recognized that not all processes can be transformed into RXW versions. It can be more difficult to obtain identical results using this method, if the loop writes values that are read back in a future version of the loop.

It can also be difficult or impossible to determine if some input and output pointers overlap. It is recognized that overlapping pointers can prevent use of RXW processes. For example, it may be difficult to determine overlap for double dereferenced pointers from a linked list in a scatter-gather direct memory access (DMA) operation. It is possible, however to do data-forwarding between the read/write buffers, either through checking addresses, or through compile time analysis to determine that pointer values do overlap.

FIG. 1 is a diagrammatic representation showing one example of a system on a programmable chip that can be implemented using high-level language programs. The system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and data memory 117. In some examples, the hardware accelerator 103 is a Digital Signal Processing (DSP) core, a cryptography accelerator, or a video processor. It should be noted that the system can include both on-chip memory 117 and off-chip memory. In one example, the data memory 117 can support variable latency or fixed latency access. The components are interconnected using an interconnection fabric 107. Any mechanism or logic for connecting components in a system is referred to herein as an interconnection fabric. In one example, the interconnection fabric is a bus. In another example, the interconnection fabric is a secondary side arbitration fabric.

The programmable chip uses different types of resources that can be interchangeably used in different allocations to implement the system on a programmable chip. In one example, the programmable chip uses logic elements for implementing each of the various components on the programmable chip. Some programmable chips also include preconfigured logic blocks as resources that can be allocated in different manners to run various subroutines.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques and mechanisms of the present invention allow the implementation of a system on a programmable chip that makes memory accesses more efficient. In one example, the following DMA operation is made more efficient:

```
do
{
*dest++=*src++
} while(count--);
```

The DMA operation can be transformed (xformed) into a read/transform/write operation so long as dest<=src[0]&& dest>=src[<read_fifo_depth>]. In one instance, the revised code looks like following:

```
int read_count=count;
int xform_count=count;
int write_count=count;
READ: non_blocking_do
{
push(READ_FIFO, *src++);
} while (read_count--);
XFORM: non_blocking_do
{
push (WRITE_FIFO, pop(READ_FIFO));
} while (xform_count--);
WRITE: non_blocking_do
{
*dest++=pop(WRITE_FIFO);
} while (write_count--);
``` where non_blocking_do is a do block which can be executed simultaneously with other code;

The READ loop stalls when the data in the FIFO starts increasing too rapidly. The XFORM loop stalls if there is no data in the READ_FIFO to remove, or if the WRITE_FIFO gets too full. The WRITE loop stalls if there is no data in the WRITE_FIFO to remove.

According to various embodiments, it is possible to have multiple read, transform, or write blocks feeding into each other. Read and transform blocks can also be nested. For example, if the read address is determined from the value at another address, the read block could have a read/transform block inside of it. There is no requirement that all read/write pointers for all loops be converted this way. It is possible to have some pointers in READ/WRITE processes and not others. In such a case, the non-transformed pointers would stay in the XFORM loop. By separating out the reads and writes into separate process, more freedom is provided to tailor the accesses to the particular memory type. For example, for code that does not access memory sequentially, it is possible to read sequentially or in a burst from memory and realign values in a FIFO before sending them in correct order downstream. The same applies for writes.

According to various embodiments, the READ/XFORM loops can send additional information downstream to XFORM/WRITE loops. An example is the value of count. It may be less expensive to buffer up its value than to recalculate it multiple times. Such information may be data or control information, such as when to exit the loop.

Figure 2:
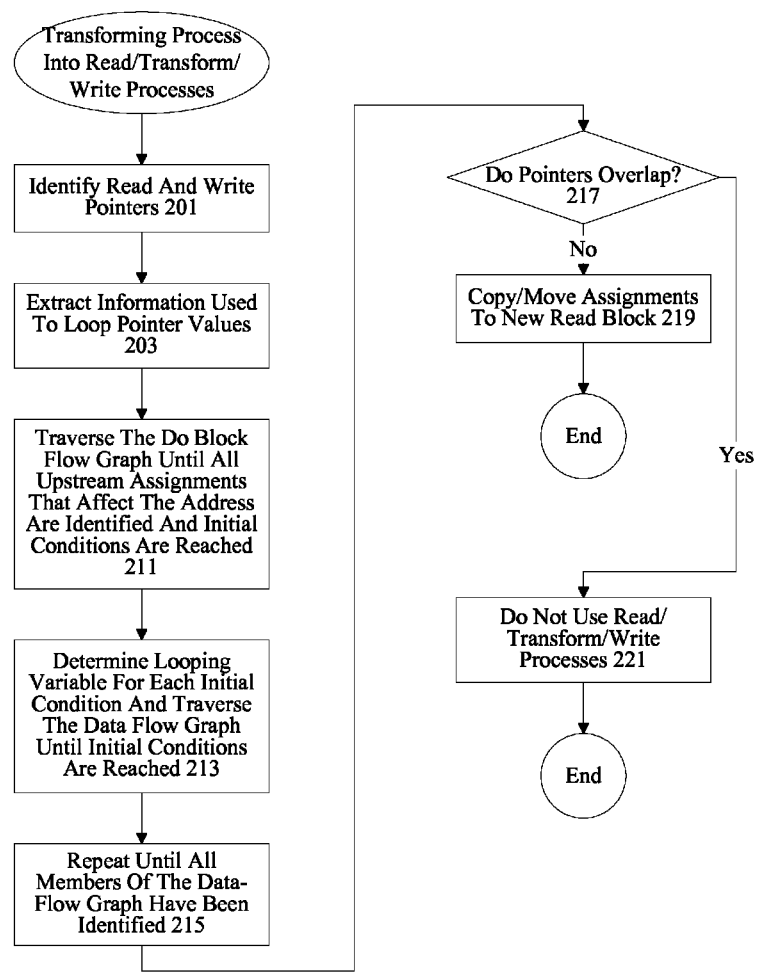
FIG. 2 is a flow process diagram showing one technique for converting a code sequence into read/transform/write blocks.

FIG. 2 is a flow process diagram showing one technique for converting a loop into multiple read/transform/write stages. At 201, read and write pointers are identified. In one example, a loop includes the following code:

```
do
{
dest[count]=src[count];
} while(count--);
```

The read and write pointers identified are dest[count] and src[count]. At 203, information in the loop required to loop pointer values is extracted. For example, the counter decrement operation is identified. Address pointers are then restated based upon the initial values of the loop. In one example, address pointers are restated by first traversing up the do-block data-flow graph until all upstream that affect the address are identified and initial conditions of the do-block are reached at 211. For example, initial conditions may correspond to a particular count value. At 213, the looping variable for each initial condition (e.g. count) that may change during each successive iteration is determined. At 215, the data-flow graph is traversed until initial conditions for these values are reached. According to various embodiments, all members of the data-flow graph that change during each successive iteration are identified. The values are then maintained. It is determined at 217 if pointers overlap. If pointers overlap, then independent read and write processes can not be made and the loop can not be converted into read transform write blocks at 221. If pointers do not overlap, assignments are copied and moved to a new read block at 219.

Figure 3:
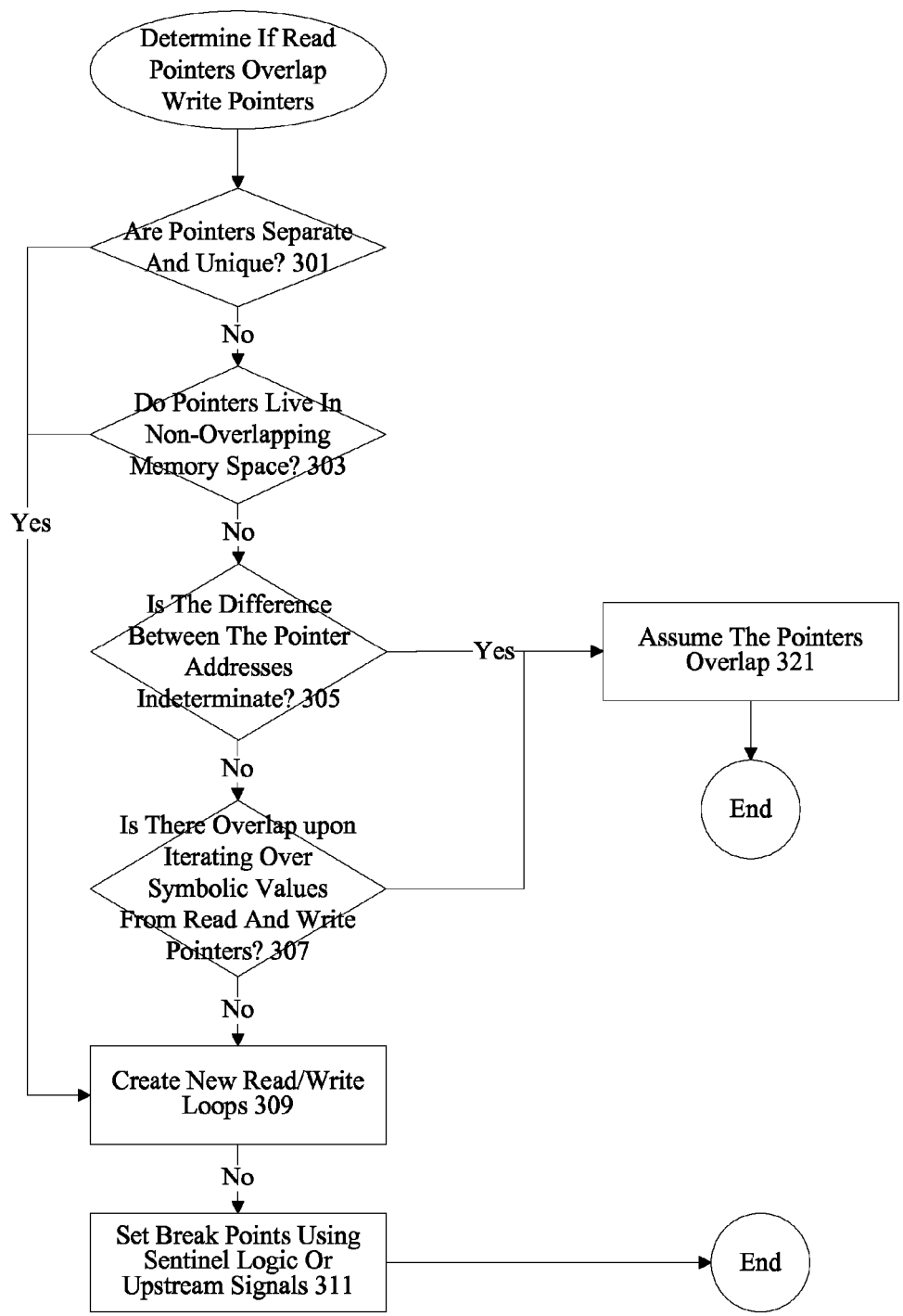
FIG. 3 is a flow process diagram showing one technique for determining pointer overlap.

A variety of techniques can be used to determine if pointers overlap. FIG. 3 is a flow process diagram showing various techniques for determining pointer overlap. At 301, it is determined if pointers are separate and unique. For example, if both pointers have been declared to be unique pointers (and they do not use the same pointer declaration), the pointers do not overlap. If the user has specified that both pointers live in non-overlapping memory space as noted at 303 then the pointers again do not overlap. Symbolic math can also be used to perform operations on pointer addresses to determine overlap. If it is determined that the difference between pointer addresses is indeterminate at 305, then pointer overlap is assumed at 321 and read/transform/write processes are not used. The difference between pointer addresses may be indeterminate, for example, when values are read from a datastream or the difference is a variable amount. At 307, it is determined if there is overlap upon iterating over symbolic values from read and write pointers. Values do not overlap if the symbolic subtraction yields a non-zero constant or known non-zero variable. According to various embodiments, this is repeated for every possible combination of read pointers and write pointers. When it is determined that pointers do not overlap, new read and write loops are created at 309.

```
// i refers to the loop count (iteration between the loop)
// in the example: count = 0; do {...} while(count+= 2). count(0)
// would be initial value of count. count(1) would be count(0) + 2.
// count(2) would be count(1) + 2. etc.
for (i = 0 ... read_fifo_depth)
{
    //j refers to the loop count (see i above)
    for (j = 0 ... read_fifo_depth)
        // k refers to the number of write pointers. It is
        // important to verify that no write pointer overlaps this
        // read pointer
        for (k = 0 ... number_of_write_pointers)
            if possible_overlap_between(&read_ptr(i), &write-ptr[k]
(j))
                overlap = 1
}
if at the end of this loop, overlap = 0, the READ loop may
be made.
```

If overlap is 0, a new READ/WRITE loop can be made, but it can still be difficult to determine when to "break" control flow of the loop. One can duplicate the sentinel logic for this loop. e.g. add (count--!=0) to the while (condition). Most loops stop based upon some iteration value, so it possible to duplicate this value for the READ loop. However, this can lead to unnecessarily replicated logic.

An alternative is to send the "break" from downstream blocks upstream at 311. It is possible to duplicate the break logic in all loops, or to have the break logic calculated in one or more loops and send the information to loops that do not break. To transfer "break" between the READ loop and the XFORM loop, an additional fifo of read_fifo_length and one bit width can communicate the break logic. For transfers between XFORM and WRITE, WRITE should write out its buffer and no more as soon as the "break" signal is received from an upstream stage. For transfers of "break" upstream from WRITE to XFORM and XFORM to READ, the upstream should stop computation as soon as possible following the downstream "break". As long as the non-speculative assignments. (i.e. writing to memory) do not occur after the break is calculated, it is non-destructive to compute an additional few cycles.

Every write pointer that does not overlap a read pointer may be put into a WRITE block. It should be noted that even if not all pointers can be put into READ or WRITE blocks, it may still be beneficial to put some pointers into the blocks. Once the read/write pointers are in their own READ/WRITE block, additional optimization may be made. According to various embodiments, the only requirement for the READ block is to deliver data in the correct order to the XFORM block. Similarly, the only responsibility for the WRITE block is to end with information written in the correct order. This is not necessarily true in all instances, e.g. if the READ/WRITE block has its pointer declared to be of type volatile. The READ and WRITE blocks may do whatever is needed to obtain faster/more efficient performance as long as the data ends up sent downstream correctly.

A variety of optimizations can be made using the techniques of the present invention. For example, values can be identified as sequential and transactions can be converted into burst transactions for better memory throughput. Values can be identified as coherent to a memory block size and commands can be issued to the arbitrator to allow for continuous transactions until completed. For read operations, results can be reoriented before passing the data to transform operations. One example is a "butterfly transform" associated with an FFT algorithm. The READ buffer could issue a sequential/ burst pattern for faster accesses and reorient the data in a local memory so that the XFORM algorithm receives values in the order it expects. Write operations can similarly have input or output reordering. In another example, READ/WRITE buffers cooperate with memory allocation/linker scripts to strategically locate information that allows for efficient extraction and replacement. An example is access of memory in descending order to an interleaved burst memory. Placing the values for that loop at the end of a burst boundary means the data can be read/written using a single burst transaction, e.g. for (count=3; count>=0; count--){out[count]=src[count];} If src is located in an interleaved position at location 3, a read burst of 4 to address 3 will read src[3], src[2], src[1], src[0].

Figure 4:
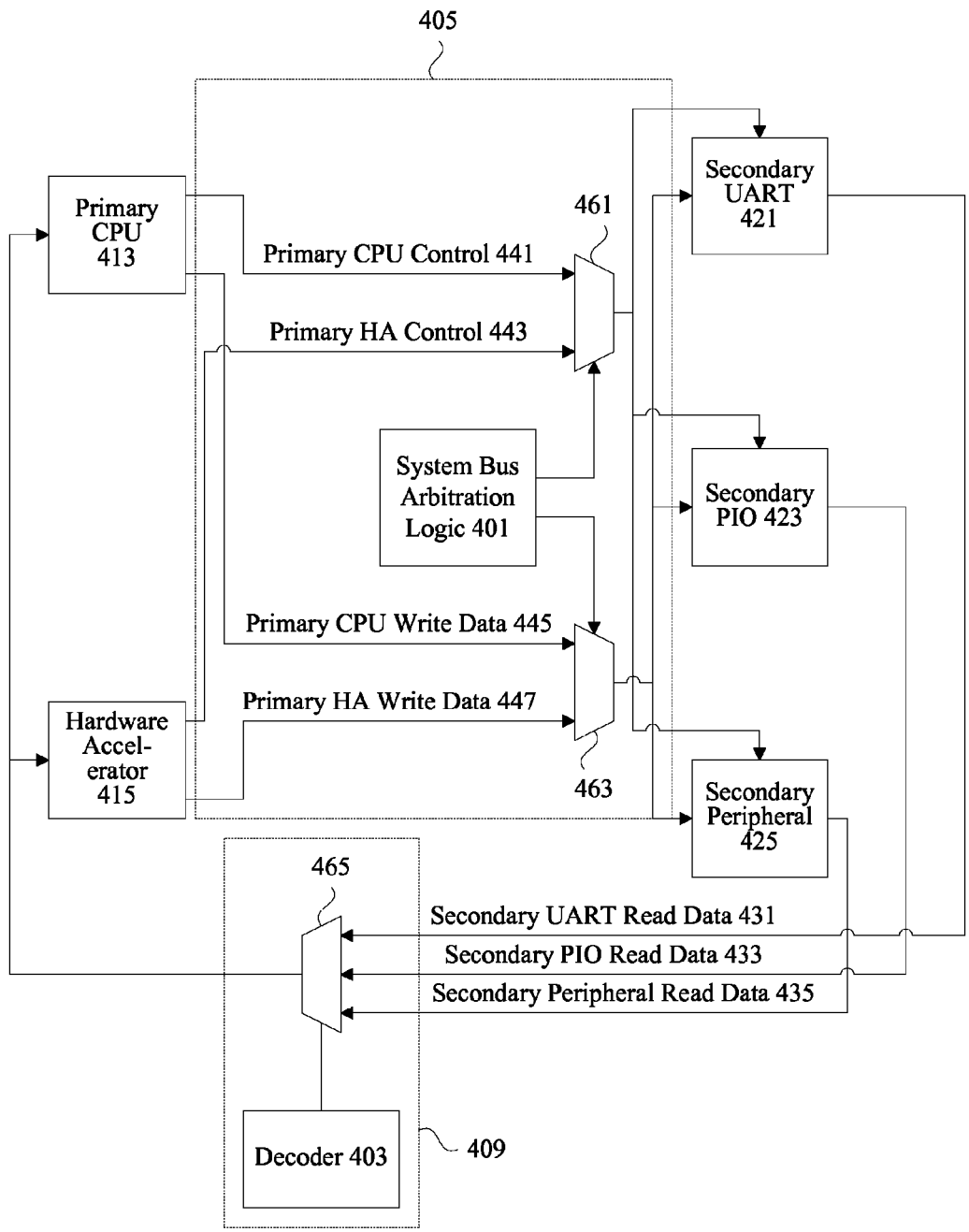
FIG. 4 is a diagrammatic representation showing a conventional bus architecture.

FIG. 4 is a diagrammatic representation depicting a hardware accelerator coupled to a microprocessor in a system using a conventional bus architecture. Although the techniques of the present invention provide significant performance benefits on a system having a secondary component side arbitration, the techniques can also be used to implement other systems such as conventional system bus implementations.

A conventional bus architecture includes a system bus arbitrator 405. A system bus arbitrator 405 includes arbitrator switching circuitry 461 and 463 as well as system bus arbitration logic 401. Logic and mechanisms for selecting an input based on a bus control signal are referred to herein as arbitration logic. It should be noted that although switching circuitry generally can be implemented using multiplexers, a variety of mechanisms including switches and transistors can be used.

Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components. Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

Logic and mechanisms for providing the control signal based on criteria such as fairness or priority are referred to herein as arbitration logic. The inputs of the arbitrator switching circuitry 461 and 463 are connected to primary CPU 413 and hardware accelerator 415. The outputs of the arbitrator switching circuitry 461 and 463 are connected to secondary UART 421, secondary PIO 423, and secondary peripheral interface 425. The outputs of the secondary components transmit information such as read data back to the primary components through a decoder 409. Mechanisms for selecting secondary components and translating control information such as addresses is referred to herein as a decoder. In conventional computer systems, there is a single decoder for each bus. A decoder 409 includes decoder logic 403 and decoder switching circuitry 465 for selecting the particular secondary component data transfer. A decoder can also be referred to as a primary side arbitrator including primary side arbitration logic and primary side switching circuitry.

A system bus typically has a set width (e.g. 64 bits, 128 bits) and allows only one primary component to actively use the bus at any one time. In conventional systems, only one primary component can access any one of the given secondary components and any given time. Multiple primary components accessing secondary components in a manner that would cause data bit collisions if performed on the same data lines is referred to herein as accessing secondary components at the same time.

In one example, a hardware accelerator is accessing a secondary PIO. While the hardware accelerator is accessing the secondary PIO, a processor can not access an SDRAM through a peripheral interface even if both the primary streaming output device and the peripheral interface are available.

The system bus arbitration logic 401 determines which primary component has access to the system bus at any time. The system bus arbitrator 401 can determine which primary component can access a secondary component based on criteria such as fairness or priority. Any component or device that is configured to ensure that only one primary component can access any one of the secondary components at any given time is referred to herein as a system bus arbitrator or bus arbitration logic. Various schemes such as weighted fairness can be implemented to improve the efficiency of secondary component access, but such schemes can increase system complexity and latency. In conventional implementations, a computer system includes a single system bus arbitrator for each bus in the computer system.

According to various embodiments, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, performance can be improved using slave side arbitration.

According to specific embodiments, it is recognized that primary components and secondary components need not be routed through a construct such as a bus. By not routing signals through a bus, a streaming output device can be implemented in a much more efficient manner. The conventional data and address lines that make up the bus are no longer resources in contention. Instead, secondary components are resources in contention, as the number of physical lines connected to each secondary component in a system can be fixed. Furthermore, by not using a bus, interconnection flexibility is enhanced.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator or slave side arbitrator. In one embodiment, there is a secondary side arbitrator for each secondary component in a computer system. In other embodiments, there is a secondary side arbitrator for selected secondary components in a system. The techniques of the present invention recognize that both primary side arbitration and secondary side arbitration can benefit from more efficient bus arbitration logic.

Figure 5:
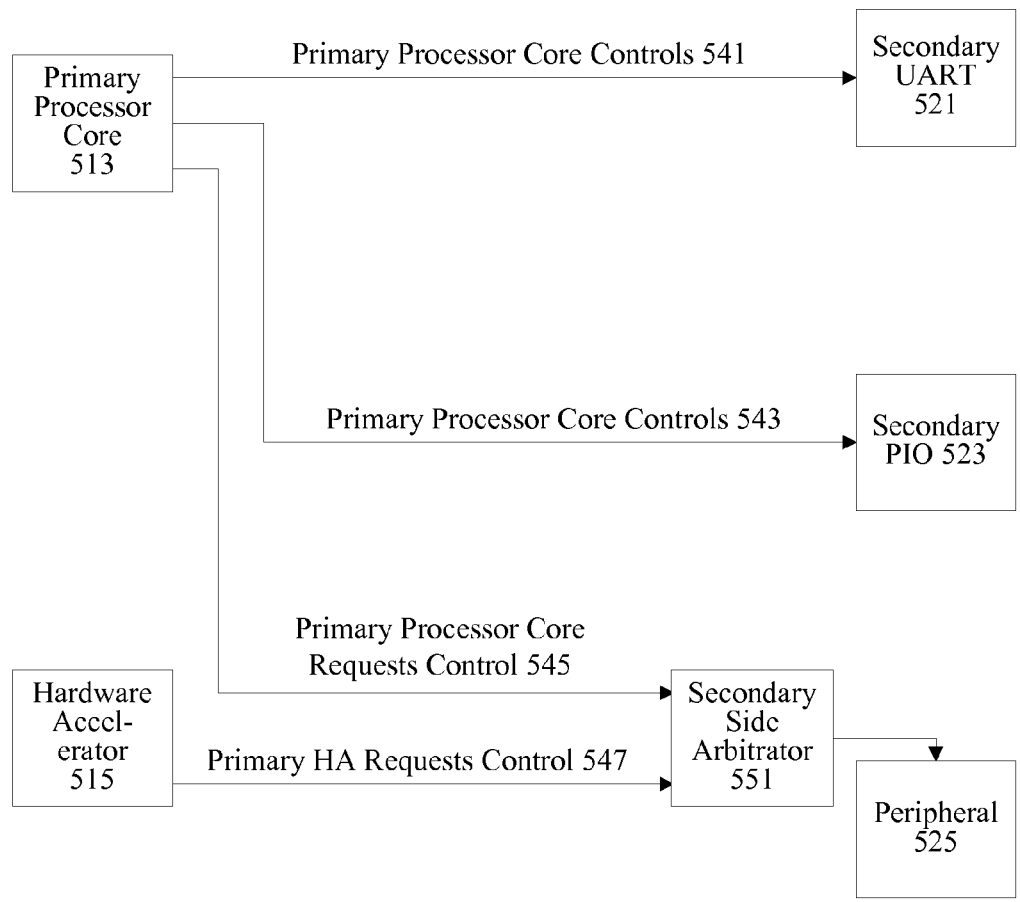
FIG. 5 is a diagrammatic representation showing an interconnection fabric.

FIG. 5 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments a secondary component such as peripheral interface 525 is associated with a secondary side arbitrator 551. However, secondary components UART 521 and PIO 523 are not associated with any arbitrator. In one example, secondary component UART 521 and secondary PIO 523 can only be accessed by primary CPU 513 and not by primary Ethernet device 515. A peripheral interface 525, however, can be accessed by both primary CPU 513 and primary Ethernet device 515.

According to various embodiments, a secondary side arbitrator 551 allows a first secondary component in a system to be accessed by a first primary component at the same time a second secondary component in the system is accessed by a second primary component. For example, peripheral interface 525 can be accessed by primary Ethernet 515 through secondary side arbitrator 551 at the same time, secondary UART 521 is accessed by primary CPU 513.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Although secondary side arbitrators provide many benefits to programmable chip designers, arbitration logic efficiency is still needed to prevent performance degradation. It is also beneficial to provide priority considerations and fairness with any arbitration logic, secondary side arbitration logic or otherwise.

Figure 6:
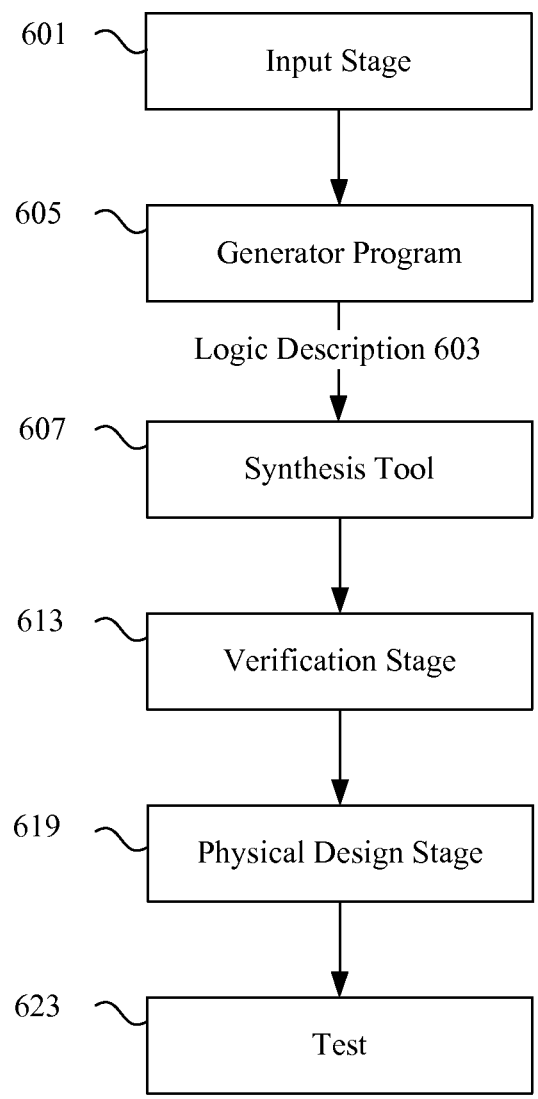
FIG. 6 is a diagrammatic representation showing a technique for implementing the programmable chip.

FIG. 6 is a diagrammatic representation showing implementation of an electronic device that can use arbitration logic according to various embodiments. An input stage 601 receives selection information typically from a user for logic such as a processor core as well as other components such as a streaming output device to be implemented on an electronic device. In one example, the input received is in the form of a high-level language program. A generator program 605 creates a logic description and provides the logic description along with other customized logic to any of a variety of synthesis tools, place and route programs, and logic configuration tools to allow a logic description to be implemented on an electronic device.

In one example, an input stage 601 often allows selection and parameterization of components to be used on an electronic device. The input stage 601 also allows configuration of variable or fixed latency support. In some examples, components provided to an input stage include intellectual property functions, megafunctions, and intellectual property cores. The input stage 601 may be a graphical user interface using wizards for allowing efficient or convenient entry of information. The input stage may also be a text interface or a program reading a data file such as a spreadsheet, database table, or schematic to acquire selection information. The input stage 601 produces an output containing information about the various modules selected.

In typical implementations, the generator program 605 can identify the selections and generate a logic description with information for implementing the various modules. The generator program 605 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 605 identifies pointers and provides ports for each pointer. One tool with generator program capabilities is System on a Programmable Chip (SOPC) Builder available from Altera Corporation of San Jose, Calif. The generator program 605 also provides information to a synthesis tool 607 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 609.

As will be appreciated by one of skill in the art, the input stage 601, generator program 605, and synthesis tool 607 can be separate programs. The interface between the separate programs can be a database file, a log, or simply messages transmitted between the programs. For example, instead of writing a file to storage, the input stage 601 can send messages directly to the generator program 605 to allow the generator program to create a logic description. Similarly, the generator program can provide information directly to the synthesis tool instead of writing HDL files. Similarly, input stage 601, generator program 605, and synthesis tool 607 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 607.

A synthesis tool 607 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 613 typically follows the synthesis stage 607. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 613, the synthesized netlist file can be provided to physical design tools 619 including place and route and configuration tools. A place and route tool typically locates logic cells on specific logic elements of a target hardware device and connects wires between the inputs and outputs of the various logic elements in accordance with logic required to implement an electronic design. The device can also be physically tested at 623.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 601, the generator program 605, the synthesis tool 607, the verification tools 613, and physical design tools 619 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 7:
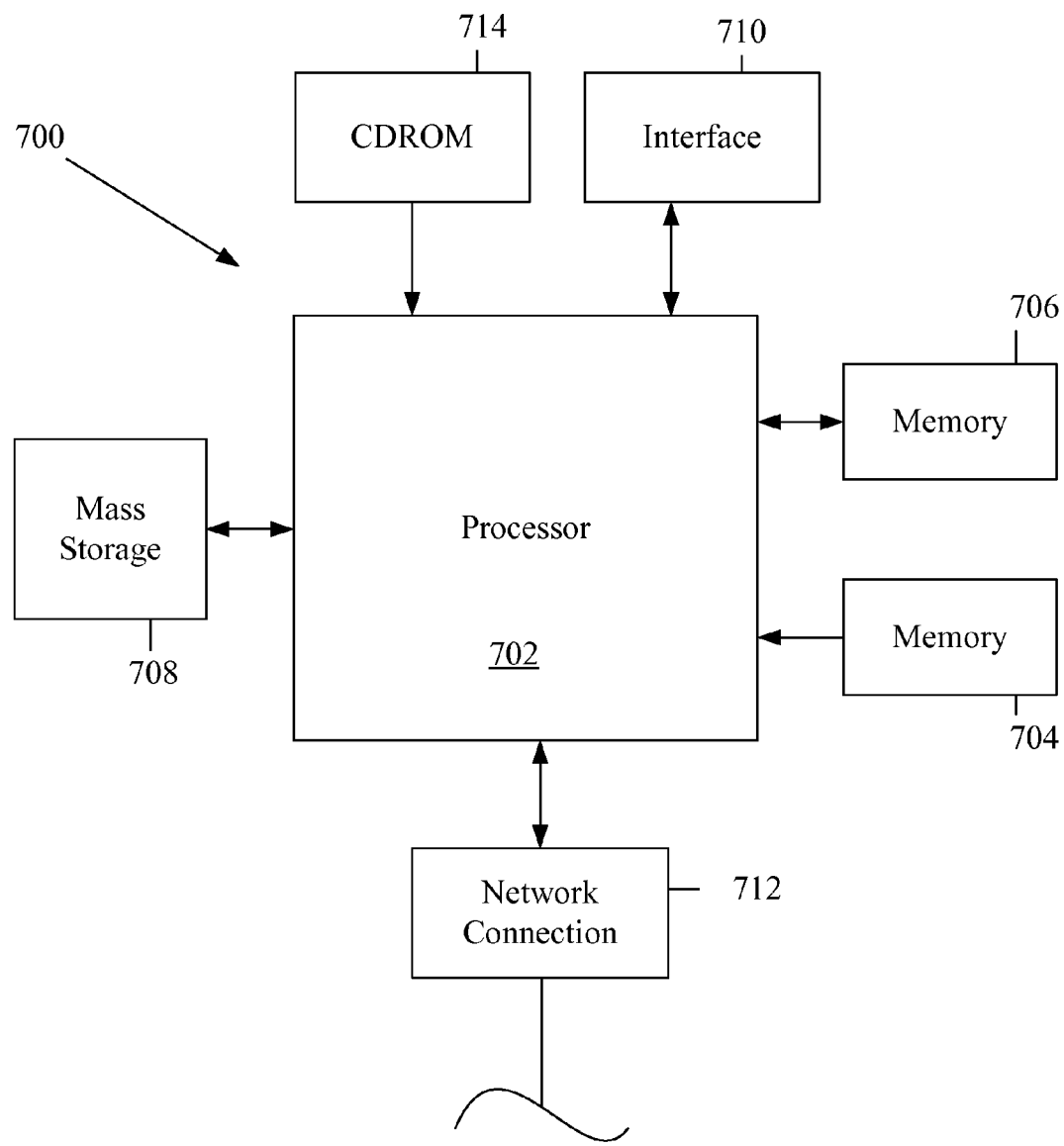
FIG. 7 is a diagrammatic representation depicting a computer system.

FIG. 7 is a diagrammatic representation showing a typical computer system that can be used to implement a programmable chip having bus arbitration with priority encoding and fairness. The computer system 700 includes any number of processors 702 (also referred to as central processing units, or CPUs) that are coupled to devices including memory 706 (typically a random access memory, or "RAM"), memory 704 (typically a read only memory, or "ROM"). The processors 702 can be configured to generate a test sequences for any designated processor. As is well known in the art, memory 704 acts to transfer data and instructions uni-directionally to the CPU and memory 706 is used typically to transfer data and instructions in a bi-directional manner.

Both of these memory devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than memory. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of memory 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. It should be noted that the system 700 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 708 or 714 and executed on CPU 708 in conjunction with primary memory 706.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the claims.

What is claimed is:

1. A method comprising:
   identifying a code sequence included in a high-level language program configured to run on a processor, the code sequence associated with memory access; and
   converting the code sequence into separate read process circuitry and write process circuitry corresponding to the code sequence to implement the code sequence on a programmable device, wherein the separate read and write process circuitry are configured to allow an arbitrary amount of read and write accesses.

2. The method of claim 1, wherein the code sequence is further converted into transform process circuitry.

3. The method of claim 1, wherein the read process circuitry and write process circuitry are configured to provide an arbitrary number of sequential memory read accesses and memory write accesses based on a buffer size.

4. The method of claim 1, wherein converting the code sequence into read process circuitry and write process circuitry comprises:
   identifying read and write pointers; and
   extracting information used to loop pointer values.

5. The method of claim 1, wherein converting the code sequence into read process circuitry and write process circuitry is based on identifying non-overlapping, unique, read and write pointer addresses.

6. The method of claim 5, wherein read and write pointers are non-overlapping if there is no overlap upon iterating over symbolic values from read and write pointers.

7. The method of claim 1, wherein converting the code sequence into separate read process circuitry and write process circuitry comprises traversing a loop flow graph until all upstream assignments that affect a plurality of pointer addresses are identified in said code sequence and initial conditions are reached.

8. The method of claim 1, wherein converting the code sequence into separate read process circuitry and write process circuitry comprises determining a looping variable for each initial condition and traversing a data flow graph until initial conditions are reached.

9. The method of claim 1, wherein converting the code sequence into separate read process circuitry and write process circuitry comprises determining a looping variable for each initial condition.

10. The method of claim 1, wherein break points are set using sentinel logic.

11. The method of claim 1, wherein data is reordered when passed from the read process circuitry to transform process circuitry.

12. A device, comprising:
   read process circuitry configured to perform memory read accesses associated with a high-level language code sequence operable to run on a processor; and
   write process circuitry configured to perform memory write accesses associated with the high-level language code sequence, wherein the read process circuitry and write process circuitry are generated from the high-level language code sequence, wherein the read process circuitry is separate from the write process circuitry, wherein the separate read and write process circuitry are configured to allow an arbitrary amount of read and write accesses.

13. The device of claim 12, further comprising transform process circuitry configured to perform an operation associated with the high-level language code sequence.

14. The device of claim 13, wherein the transform process circuitry is generated from the high-level language code sequence, and wherein generation of the read process circuitry, the transform process circuitry, and the write process circuitry comprise identifying read and write pointers and extracting information used to loop pointer values.

15. The device of claim 14, wherein generating the read process circuitry, transform process circuitry, and write process circuitry comprises identifying non-overlapping read and write pointer addresses.

16. The device of claim 15, wherein read and write pointers are non-overlapping pointers if there is no overlap upon iterating over symbolic values from read and write pointers.

17. The device of claim 13, wherein generating the read process circuitry, the transform process circuitry, and the write process circuitry comprises traversing a loop flow graph until all upstream assignments that affect a plurality of pointer addresses are identified in said code sequence and initial conditions are reached.

18. The device of claim 13, wherein generating the read process circuitry, transform process circuitry, and write process circuitry comprises determining a looping variable for each initial condition and traversing a data flow graph until initial conditions are reached.

19. The device of claim 13, wherein generating the read process circuitry, transform process circuitry, and write process circuitry comprises determining a looping variable for each initial condition.

20. A system comprising:
a processor and memory;
means for identifying a code sequence included in a high-level language program configured to run on a processor, the code sequence associated with memory access; and
means for converting the code sequence into separate read process circuitry and write process circuitry corresponding to the code sequence for implementation on a programmable device, wherein the separate read and write process circuitry are configured to allow an arbitrary amount of read and write accesses.

* * * * *